(12) United States Patent
Jung

(10) Patent No.: US 10,656,540 B2
(45) Date of Patent: May 19, 2020

(54) METHODS OF FORMING IMPRINT PATTERNS

(71) Applicant: SK hynix Inc., Icheon-si, Gyeonggi-do (KR)

(72) Inventor: Wooyung Jung, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 231 days.

(21) Appl. No.: 15/677,347

(22) Filed: Aug. 15, 2017

(65) Prior Publication Data
US 2018/0210352 A1  Jul. 26, 2018

(30) Foreign Application Priority Data

Jan. 23, 2017  (KR) .......................... 10-2017-0010734

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01)

(58) Field of Classification Search
CPC .... Y10S 977/887; G03F 9/042; G03F 7/0002; B29C 43/50
See application file for complete search history.

(56) References Cited

U.S. PATENT DOCUMENTS

| 8,476,170 | B2* | 7/2013 | Ojima | B82Y 10/00 |
| | | | | 257/E21.24 |
| 2008/0237936 | A1* | 10/2008 | Park | B29C 35/0894 |
| | | | | 264/494 |
| 2011/0031650 | A1* | 2/2011 | McMackin | B82Y 10/00 |
| | | | | 264/293 |
| 2013/0147096 | A1* | 6/2013 | Yang | G03F 7/0002 |
| | | | | 264/496 |
| 2015/0118847 | A1* | 4/2015 | Mikami | G03F 7/0002 |
| | | | | 438/694 |
| 2016/0332341 | A1* | 11/2016 | Iwase | B29C 35/0805 |

FOREIGN PATENT DOCUMENTS

| JP | 2014179548 A * | 9/2014 |
| KR | 101357933 B1 | 2/2014 |

OTHER PUBLICATIONS

L. Jay Guo; Nanoimprint Lithography: Methods and Material Requirements, Advance Materials 2007, 19, 495-513 (Year: 2007).*
Machine Translation JP2014179548 (Year: 2014).*

* cited by examiner

*Primary Examiner* — Matthew J Daniels
*Assistant Examiner* — Wayne K. Swier
(74) *Attorney, Agent, or Firm* — William Park & Associates LTD.

(57) ABSTRACT

A method of forming patterns is provided. The method may include forming a resist layer on a substrate and curing an extrusion confining pattern to define anchoring regions in the resist layer. The template may overlay over the resist layer. the template may include transfer patterns and anchor patterns. The template may be pressed to imprint the anchor patterns on the anchoring regions and to imprint the transfer patterns on a portion of the resist layer. An alignment may be performed to align the template with the resist layer.

20 Claims, 25 Drawing Sheets

EXPOSURE SEQUENCE

METHODS OF FORMING IMPRINT PATTERNS

CROSS-REFERENCE TO RELATED APPLICATIONS

The present application claims priority under 35 U.S.C 119(a) to Korean Application No. 10-2017-0010734, filed on Jan. 23, 2017, which is incorporated herein by reference in its entirety.

BACKGROUND

1. Technical Field

Various embodiments of the present disclosure may generally relate to a method of forming fine patterns and more, particularly, to a method of forming imprint patterns using a nanoimprint lithography technique.

2. Related Art

In the semiconductor industry, research efforts have been focused on developing technologies for transferring fine pattern images onto a wafer which can be employed in the development of integrated circuits with a high integration density. A nanoimprint lithography (NIL) technique has been evaluated as a promising lithography technique which is efficiently usable for fabrication of nanostructures at a low cost. In a typical NIL technique, a stamp, a template or a mold in which nanostructures are carved may be put on a resist layer which is spin-coated or dispensed on a wafer or a substrate, and the stamp (or one of the template and the mold) may be pressed toward the resist layer to transfer the nanostructures onto the resist layer. The NIL technique may be typically categorized as either a thermal type NIL technique or an ultraviolet NIL (UV-NIL) technique. The thermal type NIL technique may apply heat to the resist layer to be cured, while the UV-NIL technique may irradiate a UV-ray onto the resist layer to be cured.

When the template having carved nanostructures is pressed toward the resist layer to transfer the pattern shapes of the carved nanostructures into the resist layer, portions of the resist layer may extrude or flow out of the template. The extrusion or flowage of the resist layer may cause a non-uniform thickness of the residual resist layer (i.e., a patterned resist layer) and extruded structures of the residual resist layer. The non-uniform thickness of the residual resist layer or the protruded structures of the residual resist layer may lead to abnormal patterns.

When the template of nanostructures is pressed toward the resist layer to transfer the pattern shapes of the nanostructures into the resist layer, the pattern shapes transferred into the resist layer may be misaligned with patterns formed under the resist layer to cause an overlay error. Various methods are tried to suppress the overlay error in the nanoimprinting process.

SUMMARY

According to an embodiment, there may be provided a method of forming patterns. The method may include forming a resist layer on a substrate and overlaying template over the resist layer. The template may include transfer patterns disposed in field regions and anchor patterns disposed in field defining regions. An extrusion confining pattern may be formed in the resist layer to define pattern transfer regions corresponding to the field regions and anchoring regions to which the anchor patterns are to be imprinted. The template may be pressed to imprint the transfer patterns and the anchor patterns of the template into the resist layer. An alignment may be performed to align the template with the resist layer.

According to an embodiment, there may be provided a method of forming patterns. The method may include forming a resist layer on a substrate. An extrusion confining pattern is cured to define pattern transfer regions and anchoring regions surrounding the pattern transfer regions in the resist layer. A template may overlay over the resist layer. The template may include transfer patterns and anchor patterns, and the template may be pressed to imprint the transfer patterns on the pattern transfer regions and to imprint the anchor patterns on the anchoring regions.

According to an embodiment, there may be provided a method of forming patterns. The method may include forming a resist layer on a substrate, curing an extrusion confining pattern to define anchoring regions in the resist layer, and overlaying template over the resist layer. The template may include transfer patterns and anchor patterns. The template may be pressed to imprint the anchor patterns on the anchoring regions and to imprint the transfer patterns on a portion of the resist layer. An alignment may be performed to align the template with the resist layer.

According to an embodiment, there may be provided a method of forming patterns. The method may include forming a resist layer including a resist material on a substrate. The method may include overlaying a template over the resist layer, the template including transfer patterns disposed in field regions and anchor patterns disposed in field defining regions. The method may include forming an extrusion confining pattern in the resist layer to define pattern transfer regions corresponding to the field regions and anchoring regions to which the anchor patterns are to be imprinted. The method may include pressing the template to imprint the transfer patterns and the anchor patterns of the template into the resist layer to form an extruded portion. The method may include causing an anchoring effect with the extruded portion of the resist material to reduce movement of the substrate relative to the template.

DETAILED DESCRIPTION

Figure 1:
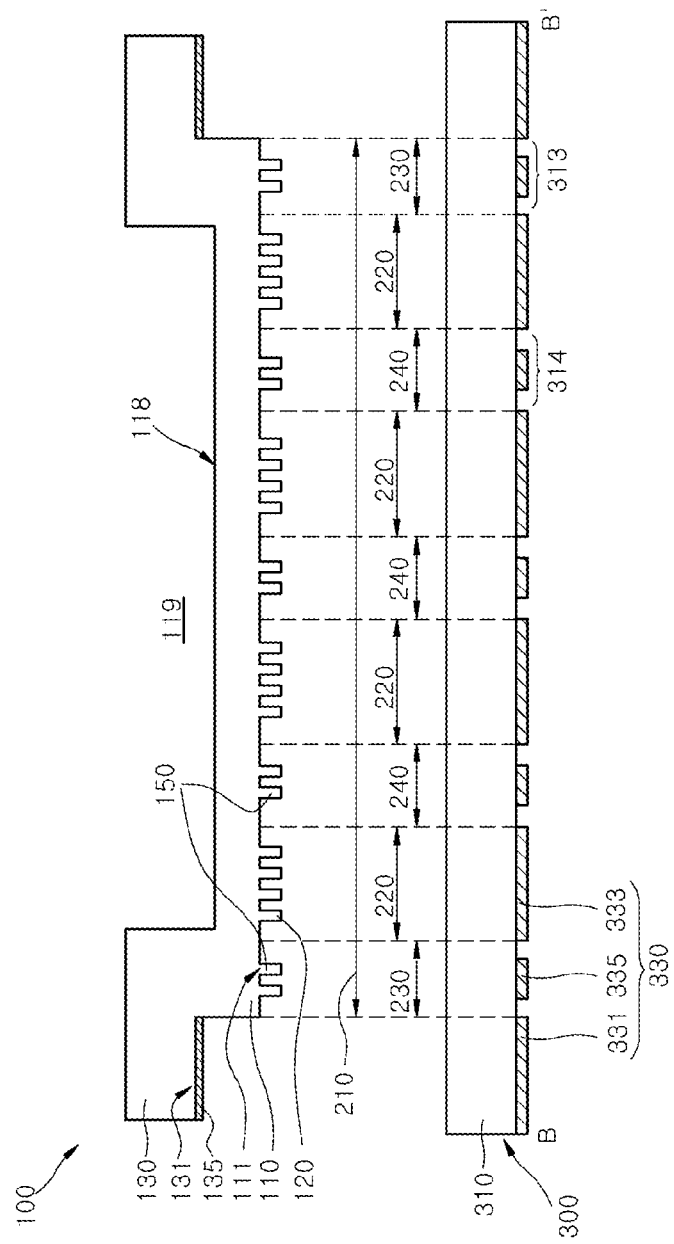
FIGS. 1 to 6 illustrate an imprinting template and a barrier photomask used in a method of forming patterns according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence. Thus, a first element in an embodiment could be termed a second element in other embodiments without departing from the teachings of the concepts.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

The following embodiments may be applied to implementation of integrated circuits such as dynamic random access memory (DRAM) devices, phase change random access memory (PcRAM) devices or resistive random access memory (ReRAM) devices. Moreover, the following embodiments may be applied to implementation of memory devices such as static random access memory (SRAM) devices, NAND flash memory devices, NOR flash memory devices, magnetic random access memory (MRAM) devices or ferroelectric random access memory (FeRAM) devices. Furthermore, the following embodiments may be applied to implementation of logic devices in which logic circuits are integrated.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
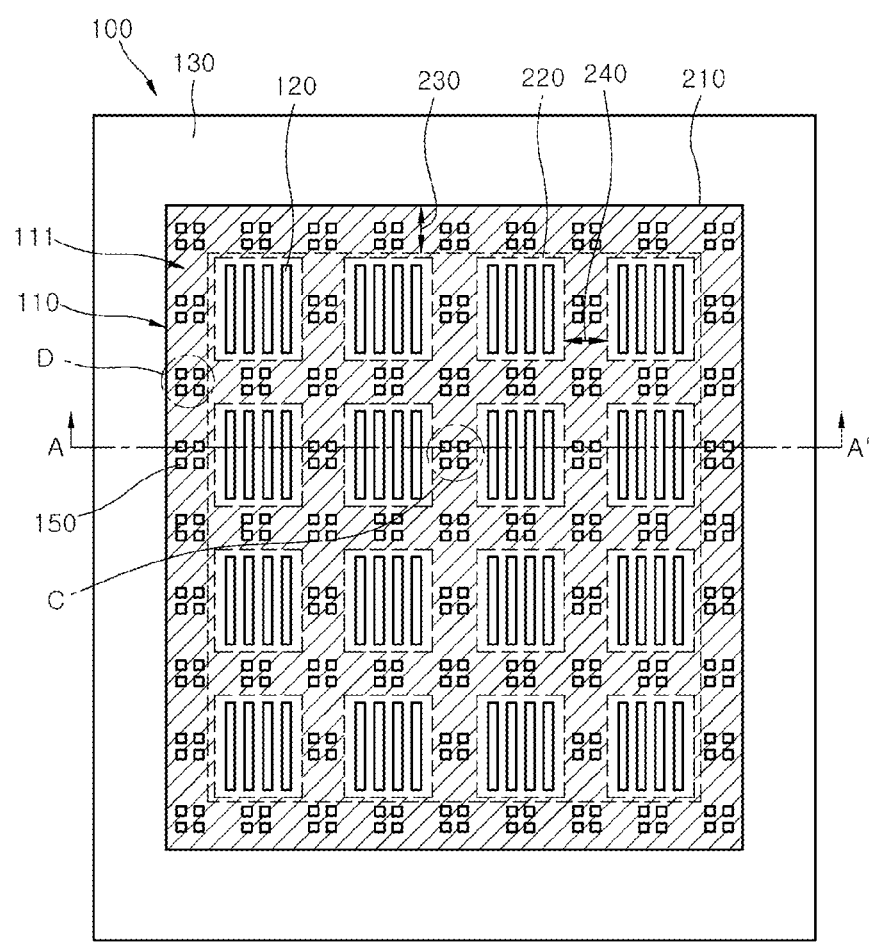
Figure 3:
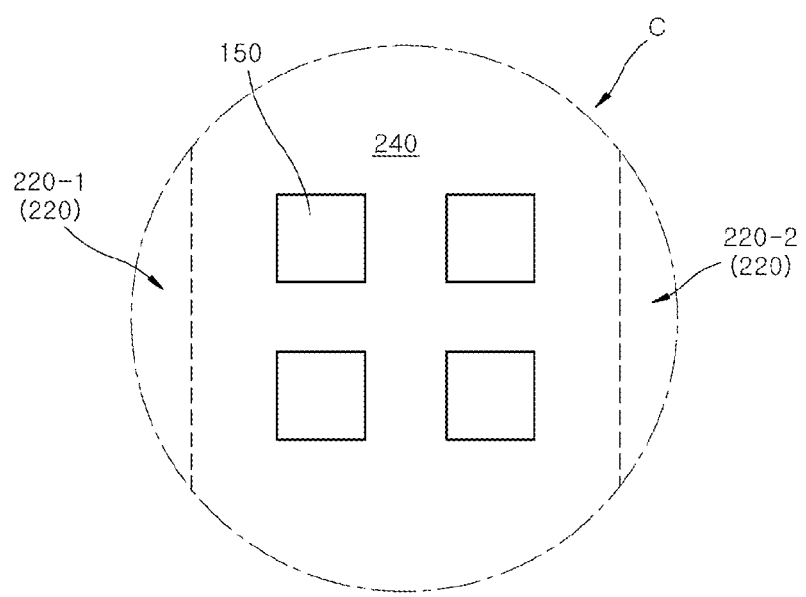
Figure 4:
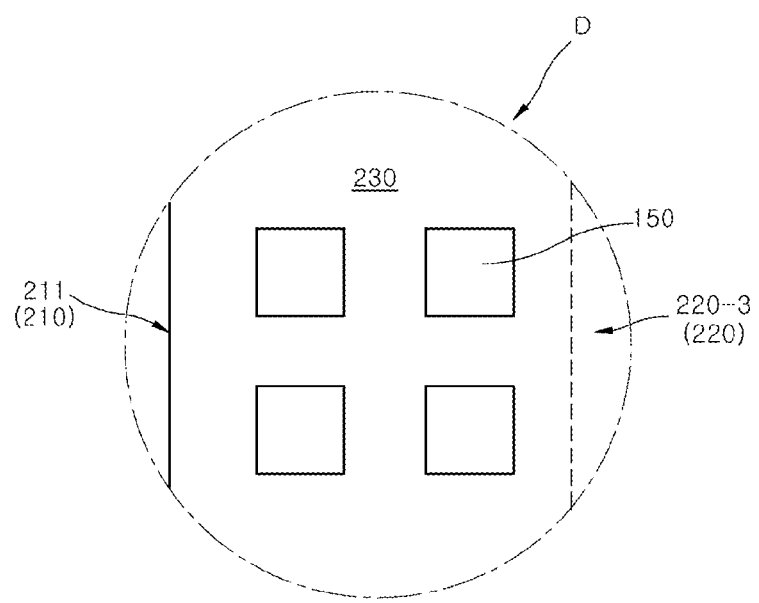
Figure 5:
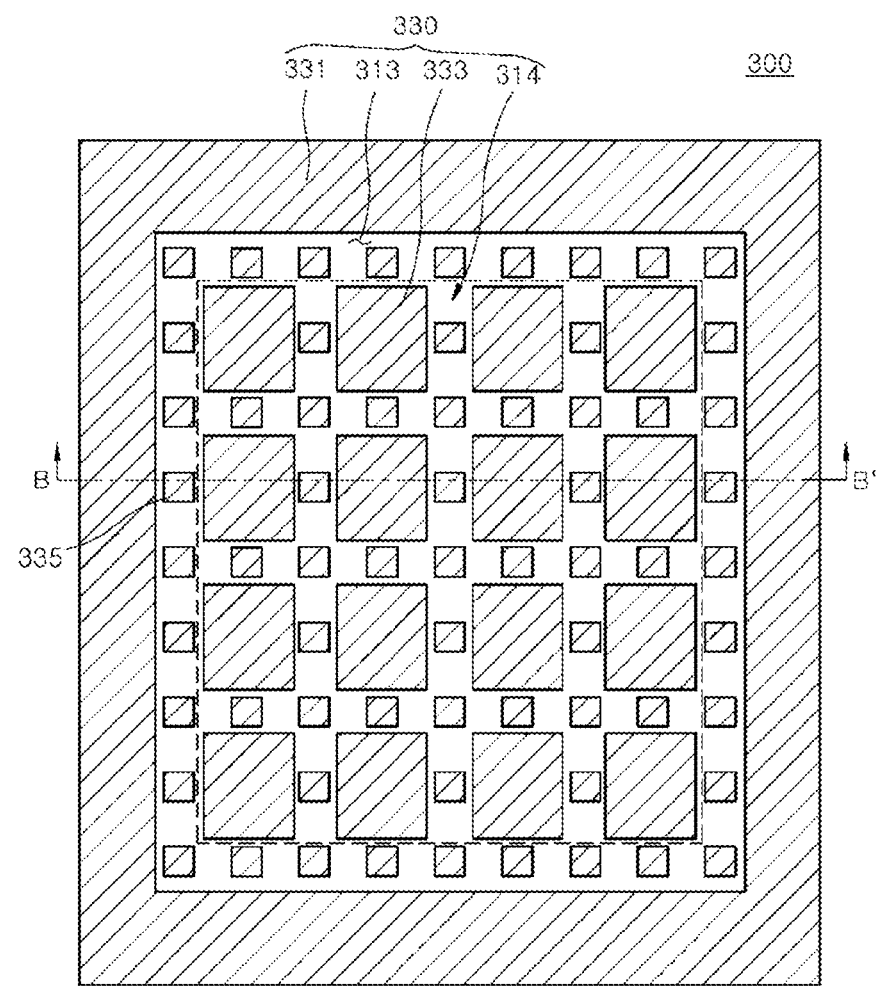
Figure 6:
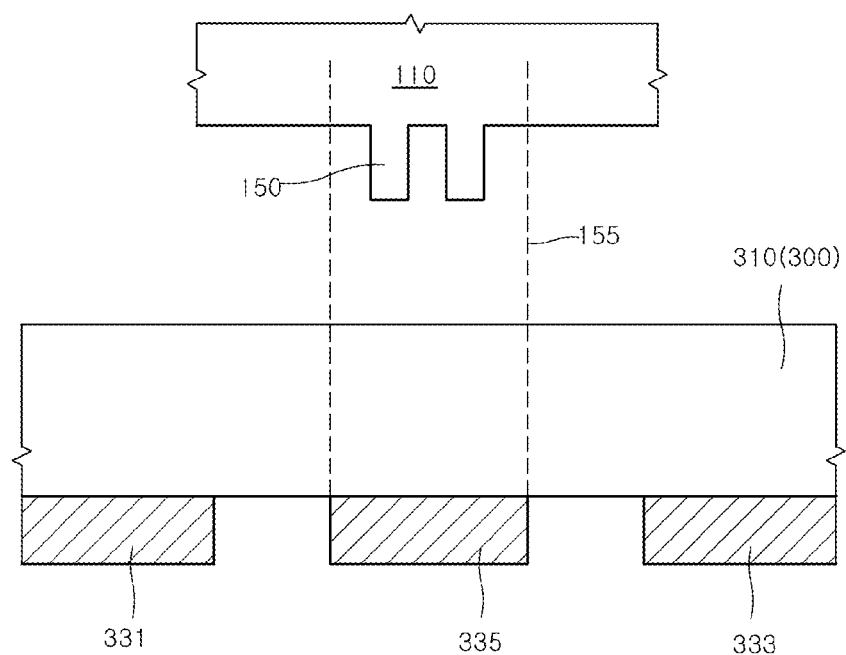

FIG. 1 is a cross-sectional view illustrating a imprinting template 100 and a barrier photomask 300 used in a method of forming patterns according to an embodiment. FIG. 2 is a plan view illustrating a patterned surface 111 of the template 100 illustrated in FIG. 1. FIGS. 3 and 4 are enlarged plan views illustrating an array of anchor patterns 150 in the patterned surface 111 of the template 100 illustrated in FIG. 2. FIG. 5 is a plan view illustrating a surface of the barrier photomask 300. FIG. 6 is a cross-sectional view illustrating a correspondence between the anchor pattern 150 illustrated in FIG. 2 and a shielding pattern 335 of the barrier photomask 300 illustrated in FIG. 5. FIG. 1 is a merged cross-sectional view taken along a line A-A' of FIG. 2 and a line B-B' of FIG. 5.

Referring to FIG. 1, the imprinting template 100 for a nanoimprint lithography (NIL) process may include the patterned surface 111 which have transfer patterns 120. The transfer patterns 120 may be formed as nanostructures to be transferred or to be replicated onto a resist layer of a wafer or of a substrate. The imprinting template 100 may be replica template. A process for transferring the transfer patterns 120 onto the resist layer will be described later.

The template 100 may include a mesa portion 110 providing the patterned surface 111 defined by the transfer patterns 120 and a body portion 130 supporting the mesa portion 110. The mesa portion 110 may protrude from the body portion 130. The body portion 130 of the template 100 may have a top recessed surface 118 which is opposite to the patterned surface 111. The top recessed surface 118 of the body portion 130 may define a cavity 119. The mesa portion 110 may be easily transformed due to the presence of the cavity 119. When the patterned surface 111 of the mesa portion 110 is in contact with the resist layer or is detached from the resist layer, the patterned surface 111 of the mesa portion 110 may easily warp to have a convex shape due to the cavity 119. A center portion of the patterned surface 111 may be first in contact with a surface of the resist layer. Thereafter, the warped surface 111 may be spread out and the remaining portions of the patterned surface 111 may be in contact with the surface of the resist layer.

A light shielding layer 135 may be disposed on a bottom surface 131 of the body portion 130 which is not covered by the mesa portion 110. The light shielding layer 135 may block the light which is used for curing the resist layer, for example, an ultraviolet (UV) ray. The mesa portion 110 may protrude from the surface 131 of the body portion 130. Thus, a level difference (i.e., step) may exist between the patterned surface 111 of the mesa portion 110 and the surface 131 of the body portion 130.

Referring to FIGS. 1 and 2, the patterned surface 111 of the mesa portion 110 may have a rectangular shape or substantially a rectangular shape from a plan view. An entire region of the patterned surface 111 may correspond to an imprinting shot region 210 defined by a single shot of the NIL process. A plurality of field regions 220 may be disposed in the imprinting shot region 210, and each of the filed regions 220 may be a pattern region in which a plurality of transfer patterns 120 may be arranged.

The field regions 220 may correspond to cell regions of memory semiconductor devices such as DRAM devices. Boundary regions 230 may be disposed to surround the field regions 220 and to provide an outer boundary of the field regions 220. The boundary regions 230 may also be disposed to provide a frame region. The boundary regions 230 may be an edge region of the patterned surface 111. Inter regions 240 may be disposed between the field regions 220 to separate the field regions 220 from each other. The inter regions 240 and the boundary regions 230 may include scribe lane regions which define cell regions as the field regions 220. The field region 220 may be defied by the inter regions 240 and the boundary regions 230.

The field defining region including the boundary regions 230 and the inter regions 240 may be disposed to have a lattice or a grid shape in an imprinting shot region 210 in a plan view. That is, the patterned surface 111 of the mesa portion 110 may be configured to include the field regions 220, each of which is disposed in any one of windows that are defined by the lattice-shaped region. The transfer patterns 120 as illustrated in FIG. 2 may have an elongated rectangular (or linear) shape or substantially an elongated rectangular (or linear) shape. Also, a plurality, for example, four transfer patterns 120 may be spaced apart at a regular interval within each field region 220. Hence, as illustrated in FIG. 2, each field region 220 includes a plurality of parallel or substantially parallel, transfer patterns 120. It is noted that the present disclosure is not limited to the aforementioned shapes and configurations. For example, the transfer patterns 120 may have a shape other than the line shape. For example, the transfer patterns 120 may have a concave or a convex shape. Also, fewer than four or more than four transfer patterns 120 may be configured within each field region 220. Also, the field regions 220 as illustrated in FIG. 2, have a rectangular shape, however, it is noted that the embodiments are not limited to such a shape.

A plurality of anchor patterns 150 may be disposed in the field defining region, that is, in the inter regions 240 and in the boundary regions 230 of the patterned surface 111. The anchor patterns 150 may be formed as dummy patterns. The anchor patterns 150 may be formed as auxiliary patterns which are not included in the transfer pattern 120. That is, the anchor patterns 150 are designed not to be disposed in the field region 220. The anchor patterns 150 may be provided as some elements of an anchoring system to help the template 100 be fixed in a predetermined position of the resist layer in a relatively shorter time. The detailed functions of the anchor patterns 150 will be described later.

Referring to FIGS. 3 and 2, the anchor patterns 150 may be disposed in the inter region 240 of the patterned surface 111 of the template 100. The anchor patterns 150 may be disposed between a first field region 220-1 and a second field region 220-2 of the field region 220. A plurality of anchor patterns 150 may be disposed along an outline of the field region 220. That is, the anchor patterns 150 may be disposed to be dispersed in the inter region 240. Two or more anchor patterns 150 may be arranged in groups and these groups of the anchor patterns 150 may be spaced apart from each other in the inter region 240. As illustrated in FIG. 2, the groups of the anchor patterns 150 may be spaced apart from one another with a greater spacing distance than the spacing between the anchor patterns 150. The anchor patterns 150 or the groups of the anchor patterns 150 may be arranged to surround the field region 220. The anchor patterns 150 may also be disposed within the boundary region 230 of the patterned surface 111 of the template 100 as illustrated in FIG. 4. The anchor patterns 150 may be disposed in an area between the edge 211 of the imprinting shot region 210 and a third field region 220-3 adjacent to the edge 211. As illustrated in FIG. 2, the anchor patterns 150 may be dispersed in the boundary region 230 and in the inter region 240. As illustrated in FIGS. 3 and 4, the anchor pattern 150 may be formed as a protruding pillar such as square pillar, elliptic column or cylindric pillar, or such as a substantially square pillar, substantially elliptic column or substantially cylindric pillar.

Referring to FIGS. 5 and 1, the extrusion confining patterns may be formed in the resist layer to be imprinted with the transfer patterns 120 of the nanostructure. The extrusion confining patterns may be formed by a process of selectively exposing the resist layer. The selective exposure process may be performed by irradiating the selected region of the resist layer with exposure light. The barrier photomask 300 may be used to guide the exposure light to be incident on a selected resist region during the selective exposure process. Alternatively, it is possible to directly control the irradiation of the exposure light so that the beam spot of the exposure light is scanned in the selected resist region for the extrusion confining patterns. outflow restriction pattern. The direct scanning of the exposure light may be performed using a digital micromirror device (DMD).

The barrier photomask 300 may be designed based on the patterned surface 111 of the template mesa portion 110. Processing steps for forming the extrusion confining patterns will be described later. The barrier photomask 300 may include shielding patterns 330 that define first and second light transmitting regions 313 and 314 which correspond to the field defining regions 230 and 240 of FIG. 2, respectively. The shielding patterns 330 may include field shielding patterns 333, frame shielding patterns 331 and anchor shielding patterns 335. The field shielding patterns 333 may correspond to the field regions 220 of FIG. 2, of the patterned surface 111 of the template mesa portion 110. The frame shielding patterns 331 may shield the boundary regions of the barrier photomask 330. The anchor shielding patterns 335 may correspond to some regions including the anchor patterns 150 of FIG. 2. The second light transmitting region 314 may be disposed between the field shield patterns 333 and may be set to correspond to the inter region 240. The first light transmitting region 313 may be disposed between the frame shielding pattern 331 and the field shielding pattern 333 and may be set to correspond to the boundary region 230. The anchor shielding pattern 335 may be set to shield a certain region in the first light transmitting region 313 and the second light transmitting region 333. That is, the anchor shielding pattern 335 may be set to shield a certain area 155 which covers the region between the anchor patterns 150 and the anchor patterns 150 and a surrounding area, as illustrated in FIG. 6.

The barrier photomask 300 may be configured to include a substantially transparent substrate 310 and the shielding patterns 330 disposed on a bottom surface of the transparent substrate 310. The shielding patterns 330 may be formed of opaque materials such as chrome (Cr). The transparent substrate 310 may be made of any suitable transparent material such as quartz. The barrier photomask 300 may be fabricated to have a binary mask structure. The barrier photomask 300 may be fabricated to have a reflective type mask structure or a phase shift type mask structure. Although FIG. 1 illustrates an example in which the first and second light transmitting regions 313 and 314 of the photomask 300 are designed to respectively correspond to the boundary region 230 and the inter region 240 of the template 100 in an area ratio of 1:1, the present disclosure is not limited thereto. For example, if an exposure step is performed using a shrinkage exposure technique in an area ratio of 4:1, the first and second light transmitting regions 313 and 314 of the photomask 300 may be designed to have planar areas which are four times the planar areas of the boundary region 230 and the inter region 240 of the template 100.

FIGS. 7 to 11 illustrate steps of forming the extrusion confining pattern 510 in a resist layer 500.

Figure 7:
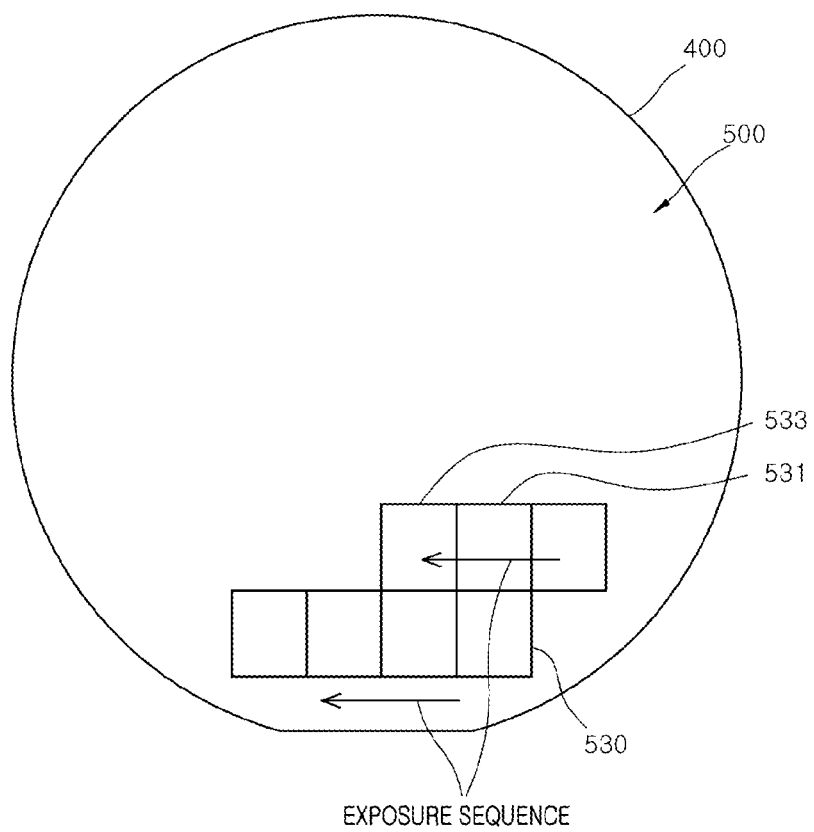
FIGS. 7 to 11 illustrate a step of forming an extrusion confining pattern in a method of forming patterns according to an embodiment.
Figure 8:
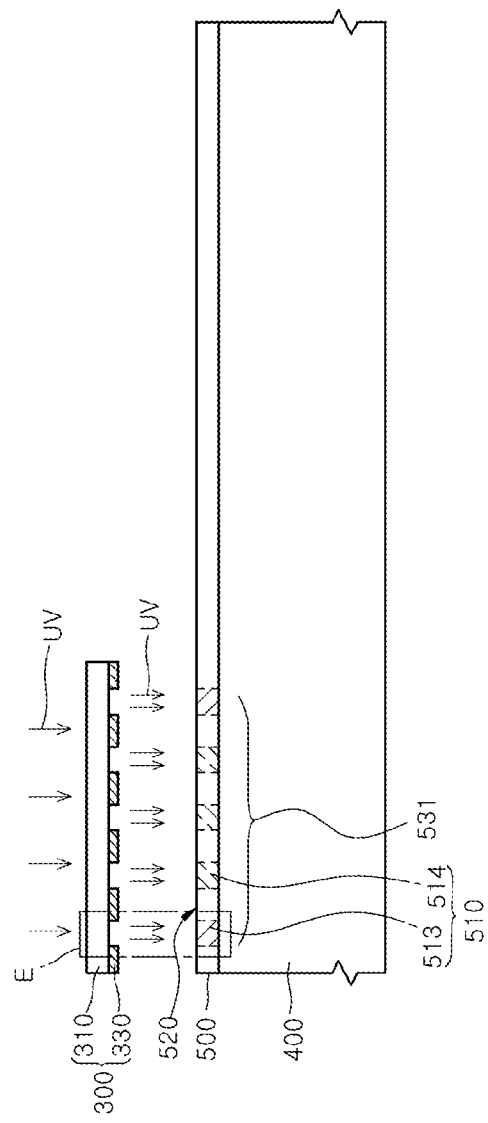

Referring to FIGS. 7 and 8, the resist layer 500 may be formed on a substrate 400 such as a wafer or a semiconductor substrate. The resist layer 500 may be formed of an imprintable medium to which the transfer patterns 120 of the nanostructures of the template 100 of FIG. 1 are to be transferred. The resist layer 500 may be formed of a curable coating layer that can be cured by exposure light such as ultraviolet (UV) light. In an embodiment, the resist layer may be formed of a resin material containing a photosensitizer or a photo initiator. The resist layer may include UV curable material used in UV imprint lithography. The resist layer may include typically a monomer such as an acrylate or methacrylate. In general, any photopolymerizable material could be used, such as a mixture of monomers and an initiator in the resist layer. The curable resist layer may also, for instance, include a dimethyl siloxane derivative. Such resist materials are less viscous than the thermosetting and thermoplastic resins used in thermal imprint lithography and consequently move much faster to fill template pattern features. Low temperature and low pressure operation also favors higher throughput capabilities.

The resist layer can be cured by exposure to light such as UV light. The resist layer may have a suitable viscosity so that it may be imprintable when it is not cured. Hence, the resist layer 500 may be formed of an imprintable, photocurable resin on which the transfer patterns 120 of the template 100 of FIG. 1 can be imprinted. The resist layer 500 may be formed by spin-coating of the imprintable, resist material on the substrate 400.

A portion of the resist layer 500 may be cured to form the extrusion confining pattern 510. For example, an exposure light, for example, an ultraviolet (UV) ray may be selectively irradiated onto a portion of the resist layer 500 using the barrier photomask 300 to form the extrusion confining pattern 510 that is cured by the UV ray. The barrier photomask 300 may be loaded over the resist layer 500 so that the light transmitting regions 313 and 314 of the photomask 300 in FIG. 3 are aligned with a predetermined portion of the resist layer 500, and an exposure light may be irradiated onto the barrier photomask 300 to perform a barrier exposure step for curing the predetermined portion of the resist layer 500. As a result, the predetermined portion of the resist layer 500 may be selectively cured by the exposure light passing through the light transmitting regions 313 and 314 of the photomask 300 to form the extrusion confining pattern 510.

The confining exposure step may correspond to a curing step for forming the extrusion confining pattern 510 in the resist layer 500. Accordingly, the cured portion of the resist layer 500 may be the extrusion confining pattern 510. The cured portion (i.e., the extrusion confining pattern 510) of the resist layer 500 may have a relatively hardened state whose fluidity is lower than the fluidity of non-cured first portions of the resist layer 500. The non-cured first portions of the resist layer 500 may be set as pattern transfer regions 520 on which the transfer patterns (120 of FIG. 1) of the template (100 of FIG. 1) are transferred. Thus, the extrusion confining pattern 510 may act as a dam or a barrier that prevents the non-cured portions, that is, the pattern transfer regions 520 from being extruded in subsequent process steps. The non-cured first portions, that is, the pattern transfer regions 520 of the resist layer 500 may correspond to the field regions (220 of FIG. 1) of the template (100 of FIG. 1) and may have a sufficient fluidity to imprint the transfer patterns (120 of FIG. 1) of the template (100 of FIG. 1) thereon in a subsequent process. The extrusion confining pattern 510 may be comprised of the cured portion of the resist layer 500. Thus, no pattern may be imprinted on the extrusion confining pattern 510. That is, the extrusion confining pattern 510 may be a pattern transfer forbidden region.

Figure 9:
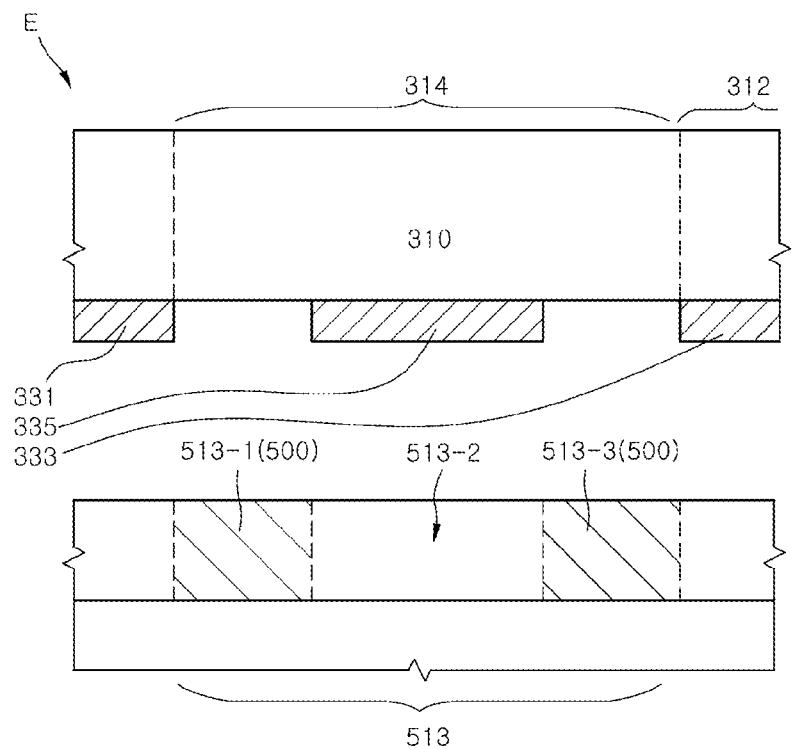

FIG. 9 illustrates an enlarged view of the portion E of FIG. 8. Referring to FIG. 9, the first confining exposure may be performed so that the non-cured second portions 513-2 are disposed in the first portion 513 of the extrusion confining pattern 510 of the resist layer 500 not to be exposed. The non-cured second portion 513-2 may be a region blocked by the anchor shielding pattern 335 from being irradiated with exposure light. The non-cured second portion 513-2 may be a region defined by the third portion 513-1 of the extrusion confining pattern 510 and the forth portion 513-3 of the extrusion confining pattern 510.

Figure 10:
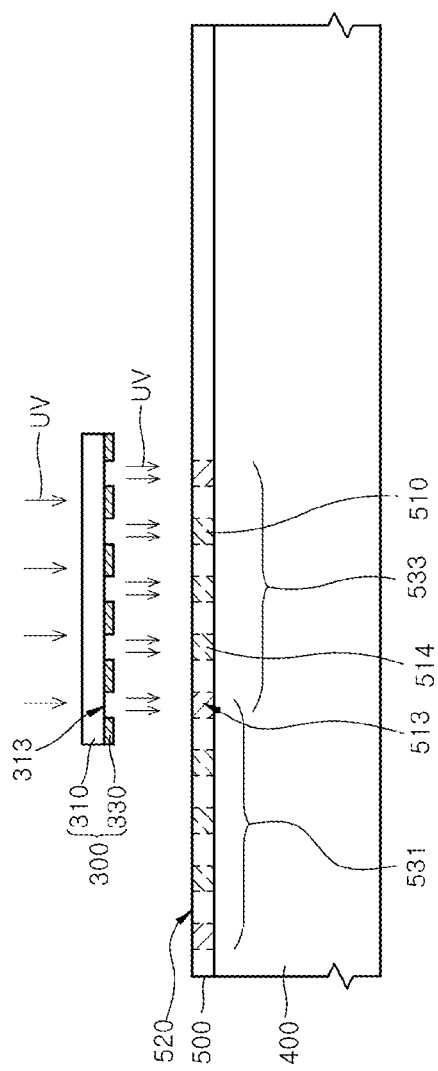

Referring to FIGS. 7 and 8, the exposure step using the barrier photomask (300 of FIG. 1) may be applied to exposure shot regions (530 of FIG. 7) of the resist layer 500. As illustrated in FIG. 8, the barrier photomask 300 may be aligned with a first exposure shot region 531 of the resist layer 500, and an exposure light (e.g., an UV ray) may be irradiated into the barrier photomask 300 to perform a first confining exposure step. After the first confining exposure step, the barrier photomask 300 may be aligned with a second exposure shot region 533 adjacent to the first exposure shot region 531 and an exposure light (e.g., an UV ray) may be irradiated onto the barrier photomask 300 to perform a second confining exposure step, as illustrated in FIG. 10.

Each of the exposure shot regions 530 of FIG. 7 may be a region corresponding to the imprinting shot region (210 of FIG. 1) of the template (100 of FIG. 1). The extrusion confining pattern 510 may be formed to correspond to the field defining region (230 and 240 of FIG. 1) of the template (100 of FIG. 1). That is, the extrusion confining pattern 510 may include the first portion 513 corresponding to the boundary region (230 of FIG. 1) of the template 100 and an second portion 514 corresponding to the inter region (240 of FIG. 1) of the template 100. When the second confining exposure step is performed, the barrier photomask 300 may be aligned with the second exposure shot region 533 of the resist layer 500 so that the first light transmitting region 313 of the barrier photomask 300 overlaps with the first portion 513 of the extrusion confining pattern 510 of the first exposure shot region 531. Accordingly, the first portion 513 of the extrusion confining pattern 510 may be located at a boundary region between the first and second exposure shot regions 531 and 533.

Figure 11:
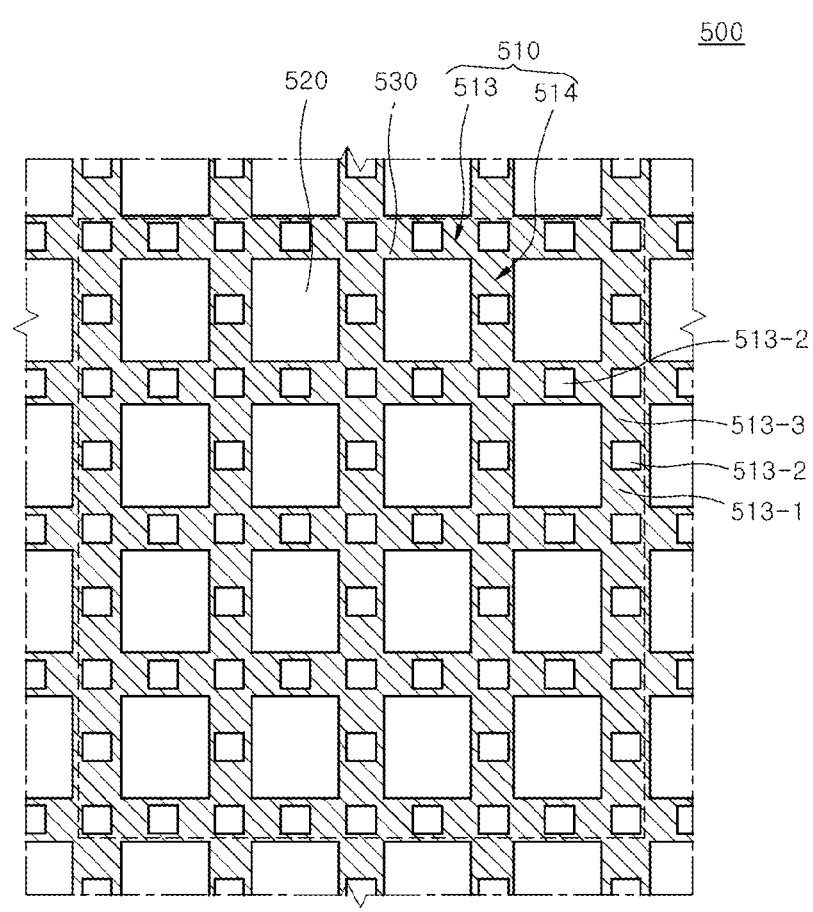

FIG. 11 is a plan view illustrating the extrusion confining pattern 510 which is formed in the resist layer 500 by sequentially applying the confining exposure steps to the exposure shot regions (530 of FIG. 7). The extrusion confining pattern 510 includes the first portion 513 and the second portion 514. The extrusion confining pattern 510 may be formed by selectively exposing predetermined portions of the resist layer 500 to an exposure light with the barrier photomask 300. The extrusion confining pattern 510 may be formed to have a lattice shape that defines a plurality of separate windows corresponding to the pattern transfer regions 520 of the resist layer 500. The pattern transfer regions 520 in each exposure shot region 530 may be defined to be spaced apart from each other by the second portion 514 of the extrusion confining pattern 510 and may be surrounded by the first portion 513 of the extrusion confining pattern 510. The non-cured second portion 513-2 may be surrounded by the third portion 513-1 and the fourth portion 513-3 of the extrusion confining pattern 510 adjacent thereto and may be dispersed in the extrusion confining pattern 510. The non-cured second portion 513-2 may be an anchoring region to which the anchor patterns 150 are to be imprinted and may be disposed along the outline of pattern transfer regions 520.

Figure 12:
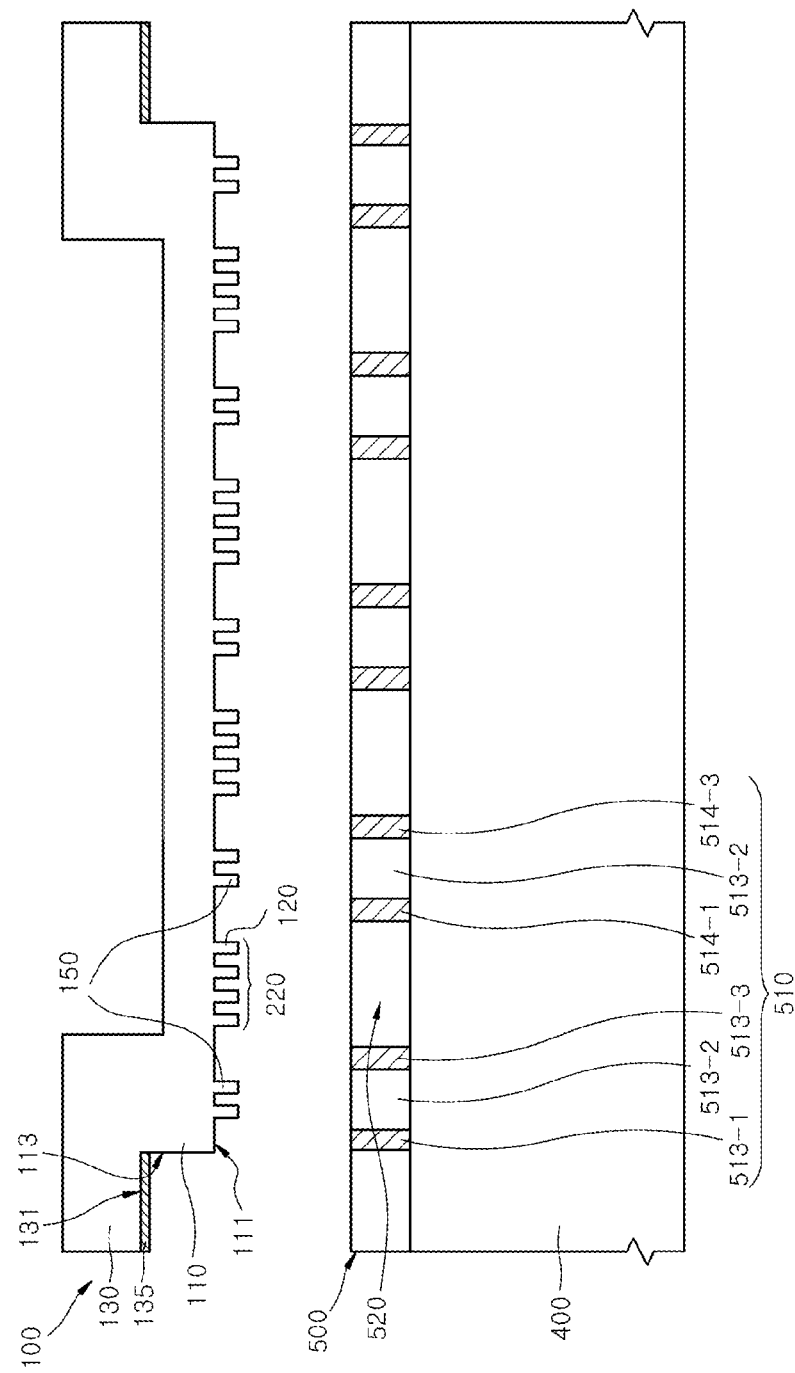
FIGS. 12 to 23 illustrate a step of transferring patterns of an imprinting template onto a resist layer in a method of forming patterns according to an embodiment.
Figure 13:
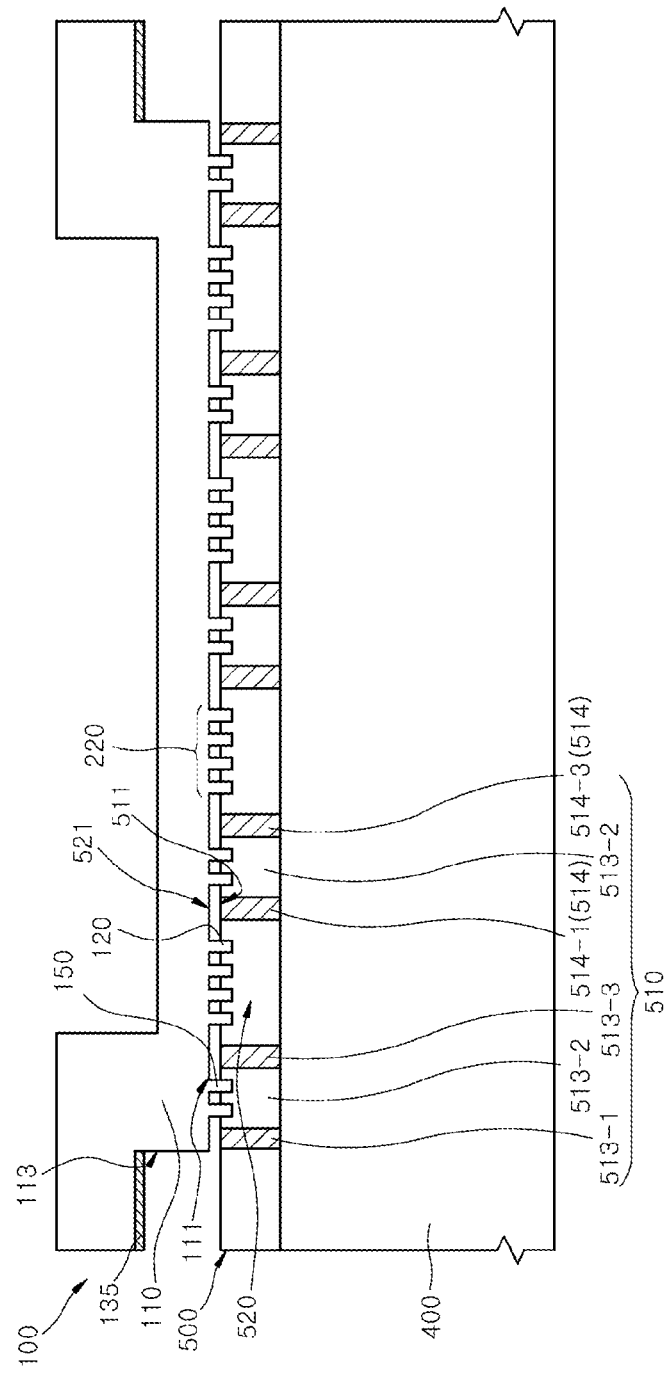
Figure 14:
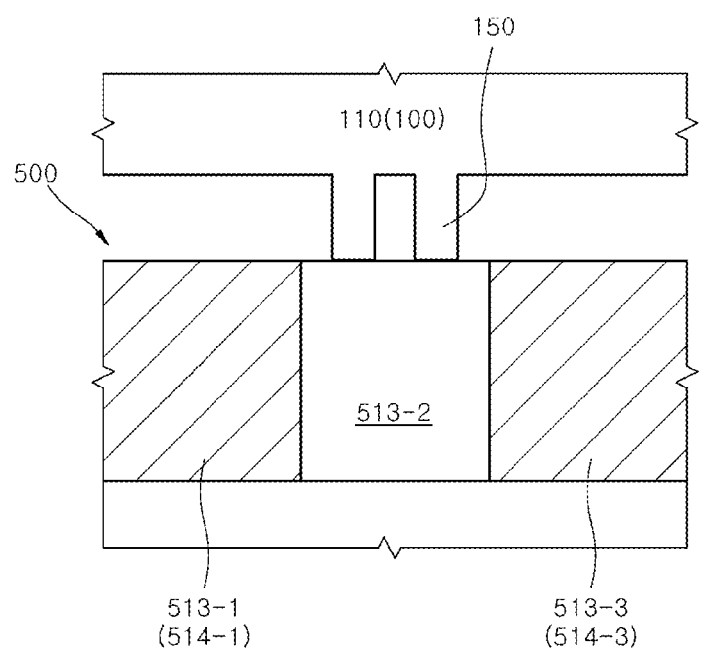
Figure 15:
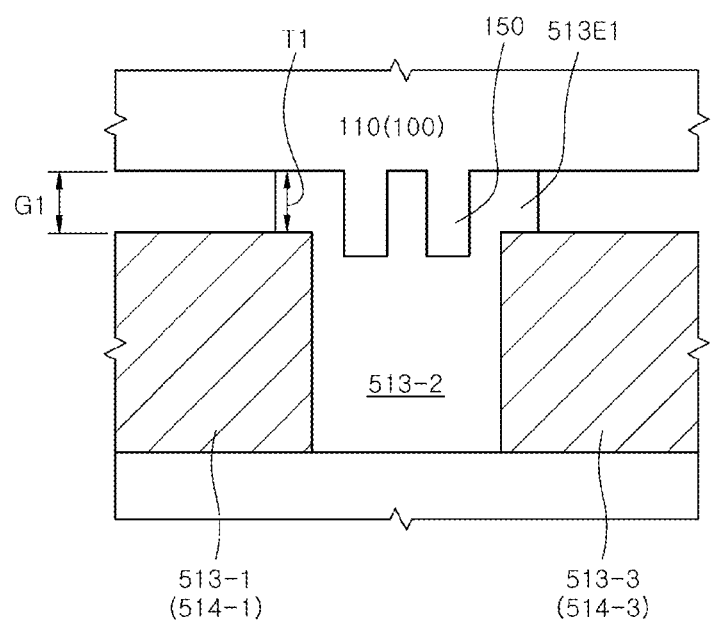
Figure 16:
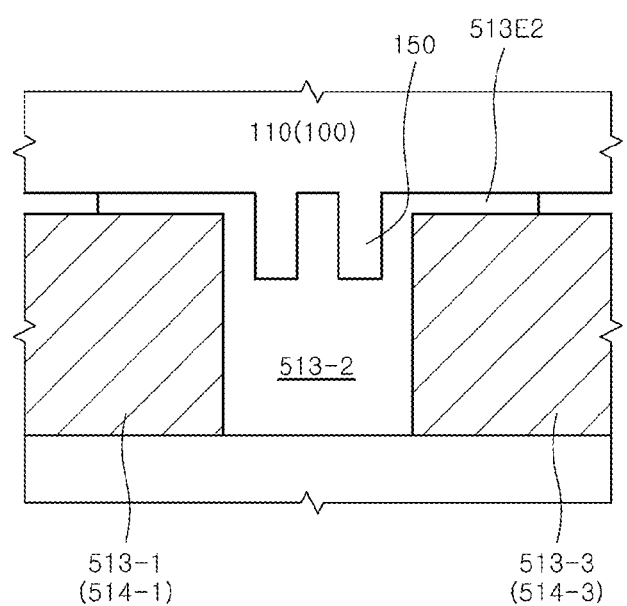
Figure 17:
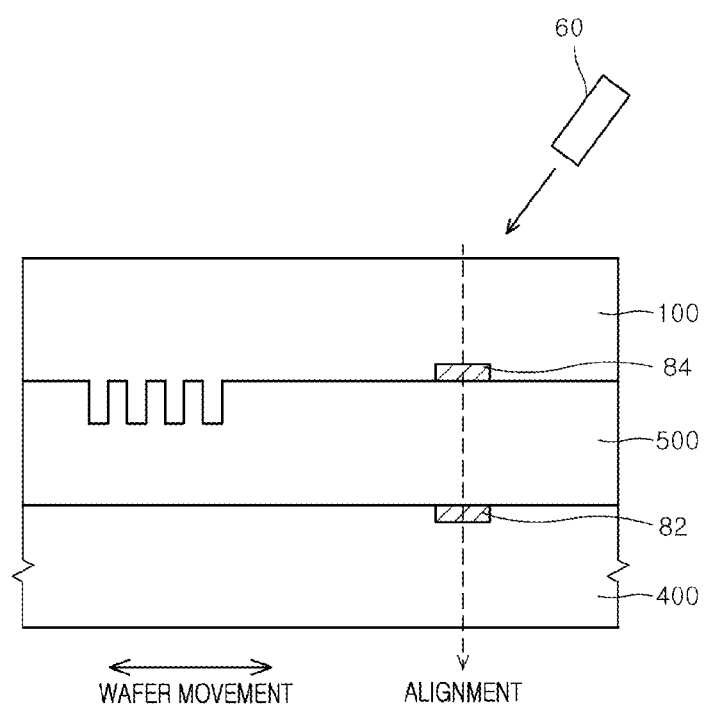
Figure 18:
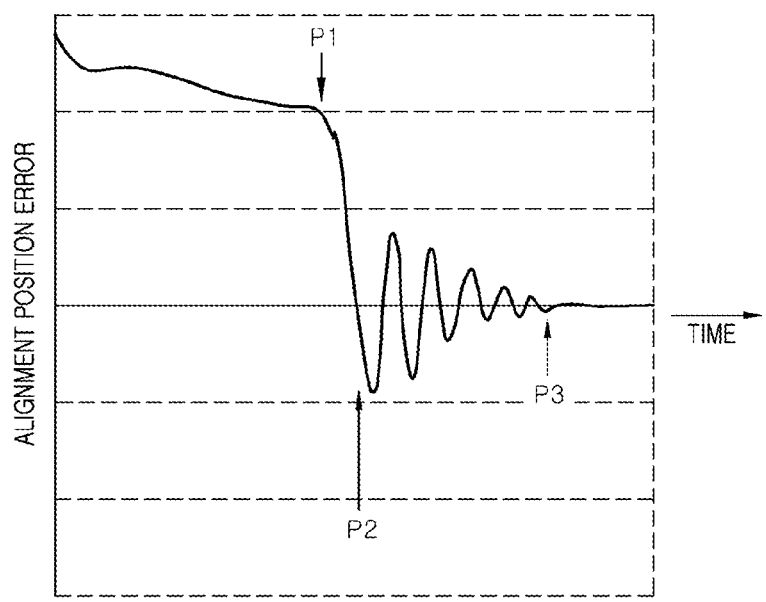
Figure 19:
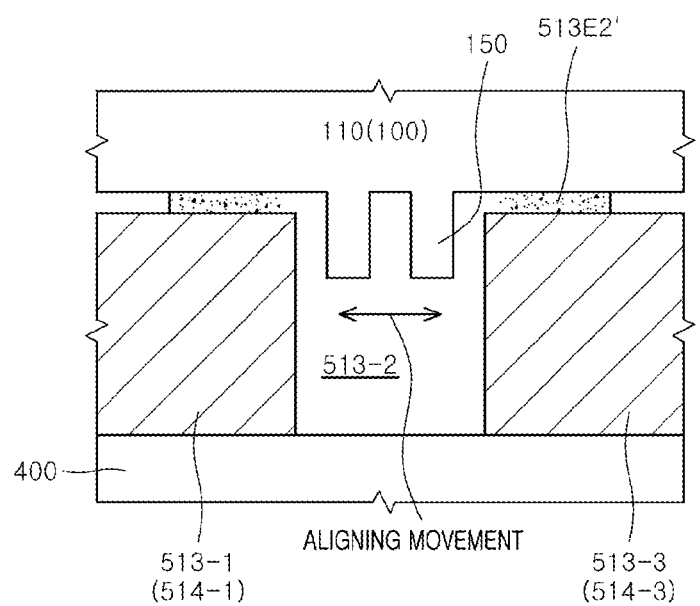
Figure 20:
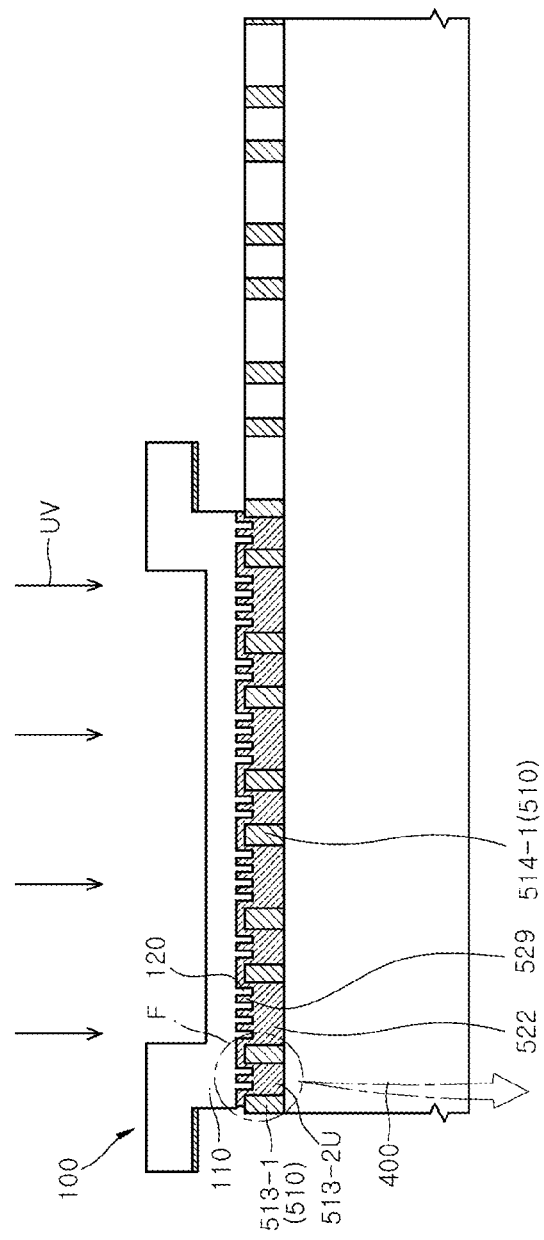
Figure 21:
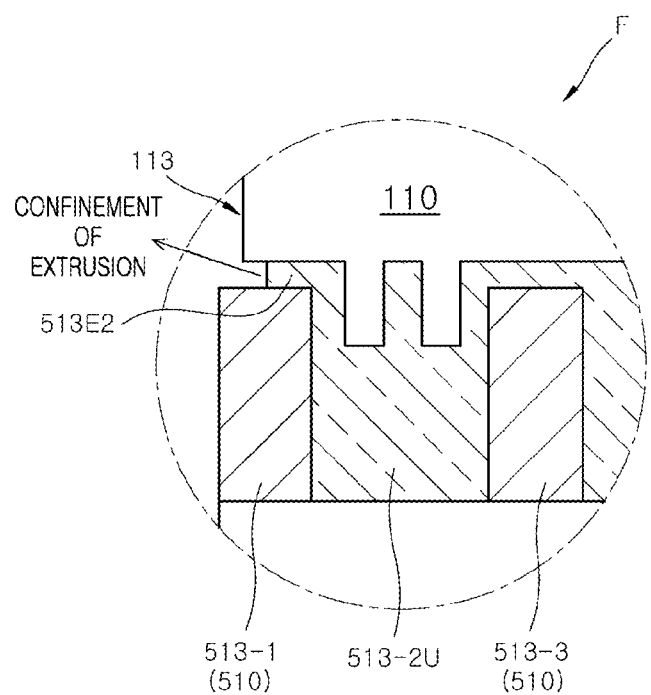
Figure 22:
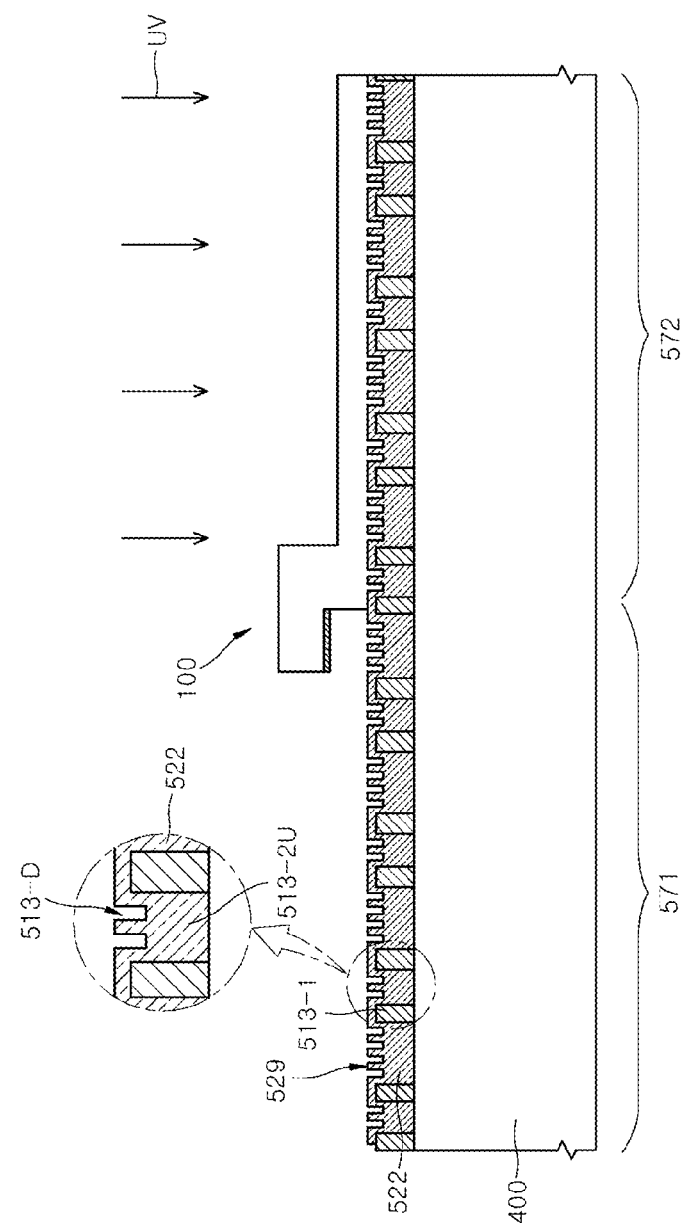
Figure 23:
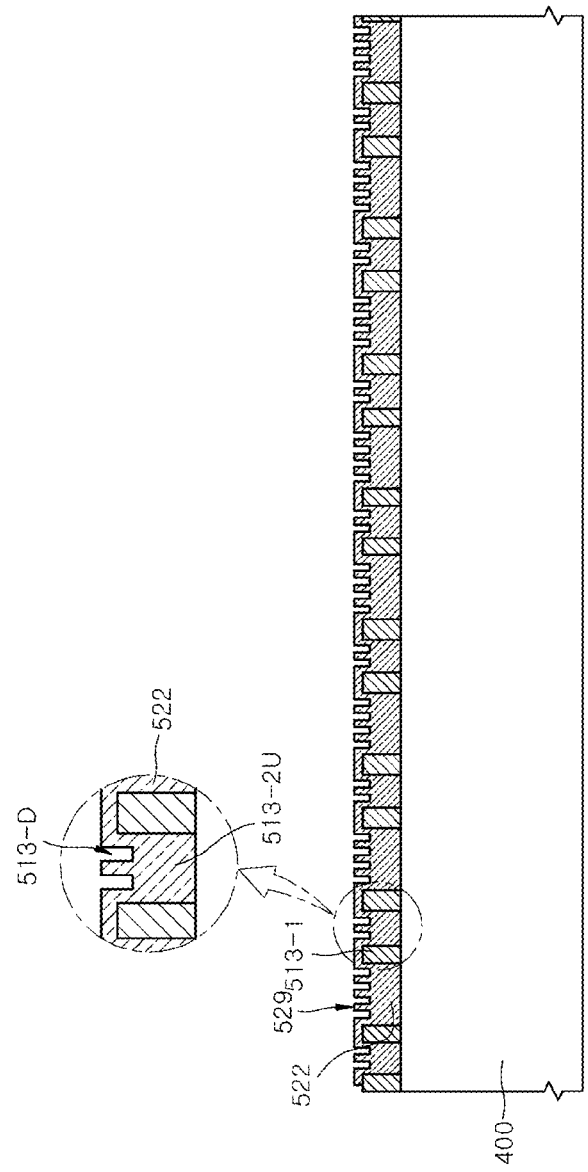

FIGS. 12 to 23 illustrate steps of transferring nano-structural patterns of the template 100 onto the resist layer 500 in a method of forming patterns according to an embodiment. FIGS. 12 and 13 are cross-sectional views illustrating the descending operation of the template 100. FIGS. 14 to 16 are cross-sectional views illustrating steps of imprinting the anchor patterns 150. FIGS. 17 to 19 illustrate an alignment operation between the template 100 and the substrate 400. FIGS. 20 and 21 illustrate steps of curing the resist layer 500. FIG. 21 illustrates an enlarged view of the portion "F" in FIG. 20. FIGS. 22 and 23 illustrate steps of performing the second imprint shot on the resist layer 500.

Referring to FIG. 12, the imprinting template 100 may be introduced to be placed over the resist layer 500 in which the extrusion confining patterns 510 are formed. For example, the template 100 may be aligned with the substrate 400 so that the patterned surface 111 of the template 100 faces the resist layer 500. The resist layer 500 as described earlier may be spin coated on the substrate 400. The substrate 400 may be a semiconductor substrate. The template 100 may be aligned with the substrate 400 so that the vertical sidewall 113 of the mesa portion 110 of the template 100 is aligned with the third portion 513-1 of the extrusion confining pattern 510 or is aligned with an edge of the first portion 513-01 of the extrusion confining pattern 510 of the resist layer 500. The template 100 may also be aligned with the resist layer 500 so that the field regions 220 of the patterned surface 111 of the template 100 respectively fully overlap with the pattern transfer regions 520 of the resist layer 500. Stated otherwise, the template 100 may also be aligned with the resist layer 500 so that when viewed from the top the field regions 220 of the patterned surface 111 of the template 100 fall fully within corresponding pattern transfer regions 520 of the resist layer 500. The anchor patterns 150 of the template 100 are arranged between the third portion 513-1 and the fourth portion 513-3 of the extrusion confining pattern 510. Also, the anchor patterns 150 of the template 100 are arranged in the non-cured second portion 513-2 between the fifth portion 514-1 and the sixth portion 514-3 of the second portion 514 of the extrusion confining pattern 510.

A light shielding layer 135 may be disposed on a bottom surface 131 of the body portion 130 which is not covered by the mesa portion 110. The light shielding layer 135 may block the light which is used for curing the resist layer, for example, an ultraviolet (UV) ray. The mesa portion 110 may protrude from the surface 131 of the body portion 130. Thus, a level difference (i.e., step) may exist between the patterned surface 111 of the mesa portion 110 and the surface 131 of the body portion 130.

Referring to FIG. 13 (and FIG. 12), the template 100 may be moved downwardly so that the transfer patterns 120 included in the field regions 220 of the template 100 come into in contact with the pattern transfer regions 520 of the resist layer 500. The template 100 may be pressed down for embedding the transfer patterns 120 of the template 100 into the pattern transfer regions 520 of the resist layer 500. As a result, the transfer patterns 120 of the template 100 may be imprinted on the pattern transfer regions 520 which contain the imprintable resist material. The resist material may fill between the transfer patterns 120. The anchor patterns 150 also contact the non-cured second portion 513-2 of the resist layer 500 as the transfer patterns 120 come into in contact with the pattern transfer regions 520 of the resist layer 500. The portions between the anchor patterns 150 are filled with the resist material so that the anchor patterns 150 are fully buried in the resist layer 500. The non-cured second portion 513-2 may be an anchoring region in which the anchor patterns 150 are to be transferred or imprinted.

FIGS. 14 to 16 illustrate the process in which the anchor patterns 150 of the template 100 are imprinted. The transfer patterns 120 of the template 100 may be imprinted substantially simultaneously when the anchor patterns 150 are imprinted as illustrated in FIGS. 14 to 16. Referring to FIG. 14, the template 100 is lowered so that the anchor patterns 150 contact the surface of the non-cured second portion 513-2 of the resist layer 500 at the tips. Although not illustrated, the end portions of the transfer patterns 120 of the template 100 may also contact with the surface of the non-cured first portion, that is, the pattern transfer regions 520 of the resist layer 500.

Referring to FIG. 15, in the state that the anchor patterns 150 or the transfer patterns 120 of the template 100 are in contact with the resist layer 500, the template 100 is further lowered or pressed so that the resist material may be fully filled between the anchor patterns 150 and between the transfer patterns 120. As some portion of the anchor patterns 150 are impregnated into the non-cured second portion 513-2 of the resist layer 500 or as the portions between the anchor patterns 150 are filled with the resist material, some portions 513E1 of the resist material may be extruded out of the third portion 513-1 and the fourth portion 513-3 of the extrusion confining pattern 510. As some portion of the anchor patterns 150 are impregnated into the non-cured second portion 513-2 of the resist layer 500 or as the portions between the anchor patterns 150 are filled with the resist material, some portions 513E1 of the resist material may be extruded out of the fifth portion 514-1 and the sixth portion 514-3 of the extrusion confining pattern 510. The thickness T1 of the extruded portions 513E1 may be equal to the gap G1 between the template 100 and the resist layer 500. Similarly, as the transfer patterns 120 are imprinted in the pattern transfer region 520, some portions of the resist materials in the pattern transfer region 520 may be flowed or extruded to the space (521 of FIG. 13) over the upper surface 511 of the extrusion confining pattern 510. However, the extrusion confining pattern 510 may act as dam to restrict the extrusion of the resist material so that the length and the amount of the extrusion portion (513E1 in FIG. 15) can be limited.

Referring to FIG. 16, the template 100 may be further lowered or pressed so that the anchor patterns 150 are substantially completely impregnated into the non-cured second portion 513-2 of the resist layer 500 or the resist material substantially completely fills between the anchor patterns 150. At this time, the extrusion portion (513E1 in FIG. 15) may be extended to form widen extrusion portion 513E2. The thickness of the extrusion portion 513E2 may be made thinner. However, since the extrusion confining pattern 510 restricts the flow of the resist material, the distance over which the extrusion portion 513E2 is expanded is limited, so that the extrusion portion 513E2 may be suppressed form reaching the side (113 in FIG. 13) of the mesa portion 110 of the template 100.

Referring to FIG. 13, the second portion 514 of the extrusion confining pattern 510 including the fifth portion 514-1 and the sixth portion 514-3 may act as supporters for supporting the patterned surface 111 of the mesa portion 110 in performing the imprint step. The mesa portion 110 may be supported by the second portions 514 of the extrusion confining patterns 510 to prevent the mesa portion 110 from being bent. Accordingly, an excessive pressure may be suppressed or prevented from being applied to the resist material in the pattern transfer region 520 in which the transfer patterns 120 of the mesa portion 110 are in contact with. The extrusion confining patterns 510 may suppress the lowering or the bowing of the template 100 that is caused by the excessive pressure on the mesa portion 110 of the template 100. Accordingly, the phenomenon that the resist material flows out may be further suppressed or prevented. As a result, extrusion of the resist material out of the pattern transfer regions 520 is suppressed or substantially prevented during the imprinting step. Accordingly, a thickness uniformity of the residual layer of the resist layer 500 may not be degraded even though the imprint steps are performed. As a result, accurate and fine nano-patterns may be imprinted on the resist layer 500.

When performing a filling step in which the anchor patterns 150 of the template 100 and the transfer patterns 120 are substantially completely filled with the resist material, the alignment between the template 100 and the substrate 400 may be performed.

FIG. 17 illustrates an alignment operation according to an embodiment. FIG. 18 illustrates an attenuation phenomenon of an alignment position error in a nanoimprint lithography technique, according to an example of an embodiment.

Referring to FIG. 17, an alignment detector 60 may be configured to monitor the alignment positions between a first alignment key 82 and a second alignment key 84. The first alignment key 82 may be disposed in the substrate 400 and the second alignment key 84 may be disposed in the mesa portion 110 of the template 100. The alignment detector 60 may be configured to include a detection light illumination system that irradiates a light toward the first and second alignment keys 82 and 84 and a light receiving system that receives images or interference patterns of the first and second alignment keys 82 and 84. The alignment detector 60 may detect relative position differences or overlap differences between the first alignment keys 82 and the second alignment keys 84 to extract parameters employed in the calculation of the overlay error (also referred to as an alignment error). When the alignment error is detected between the template 100 and the substrate 400, the substrate 400 may be moved in a direction opposite to the direction in which the pattern was shifted to compensate for the alignment error. The alignment of the template 100 may be performed by repeating the monitoring and compensation operations.

FIG. 18 illustrates a result of monitoring an alignment position error as the alignment operation is performed. The point of P1 may indicate the monitored alignment position error at the point where the anchor pattern 150 or transfer pattern 120 begins to contact the surface of the resist layer 500 as illustrated in FIG. 14. The point of P2 may indicate the monitored alignment position error at a point where the anchor pattern 150 or the transfer pattern 120 starts to be impregnated into the resist layer 500. The point of P3 may indicate the monitored alignment position error at the point where the filling process of the resist material is terminated.

In the time period between the point P2 where the filling process of the resist material is started and the point P3 where the filling process of the resist material is terminated, the values of the alignment position error may be gradually attenuated over time due to an anchoring system including the anchor pattern 150, the non-cured second portion 513-2 and the extrusion confining pattern 510. The anchoring system may serve to confine the variation of the position of the template 100 on the resist layer 500 and induce fixing or anchoring of the template 100.

Referring to FIG. 19, when proceeding the alignment, a relative movement of the substrate 400 or a relative movement of the template 100 may be accompanied by physical vibrations. The resist layer 500 positioned between the template 100 and the substrate 400 may flow with a relatively low viscosity. Accordingly, the resist layer 500 may act as a lubricant between the template 100 and the substrate 400. The substrate 400 or the template 100 may move even with a slight mechanical vibration, and the relative positions may be displaced from each other. The alignment position error component due to such vibration may serve as a factor for lowering the accuracy of the alignment.

The movement of the substrate 400 or the template 100 due to the flow of the resist layer 500 may adversely affect the progress of the alignment. Despite the alignment, the substrate 400 or the template 100 may slide with respect to the resist layer 500 due to the fluidity of the resist layer 500 even with minute vibrations. Accordingly, the alignment error components due to the vibrations may be caused.

The anchor pattern 150 is impregnated into the non-cured second portion 513-2 of the resist layer 500 so that the resist material may be extruded over the third portion 513-1 and the fourth portion 513-3 of the extrusion confining pattern 510 to form the extruded portion 513E2'. The anchor pattern 150 is impregnated into the non-cured second portion 513-2 of the resist layer 500 so that the resist material may be extruded over the fifth portion 514-1 and the sixth portion 514-3 of the extrusion confining pattern 510 to form the extruded portion 513E2'. The extruded portion 513E2' of the resist material may have a relatively thin thickness compared to the thickness of the resist layer 500 or the thickness of the non-cured second portion 513-2. The alignment operation to compensate for the alignment position errors, i.e., compensating movement of the substrate 400, may cause shear stress in the resist layer 500 or in the extruded portion 513E2'. The shear stress may induce crystallizations of the resist material. The shear stress may be concentrated in the extruded portion 513E2' of the resist material so that the crystallization of the resist material may be locally concentrated in the extruded portion 513E2'.

The local crystallization of the resist material may increase the viscosity of the resist material so that the extruded portion 513E2' of the resist material may cause an anchoring effect to prevent movement of the substrate 400 relative to the template 100. The extent of movement or vibration of the substrate 400 relative to the template 100 may be made smaller by the extruded portion 513E2' of the resist material. Accordingly, as the alignment is progressed, the alignment position error may gradually become reduced. Due to the anchoring effect, it may be possible to reduce the time for completing the alignment.

Referring to FIGS. 20 and 21, while the anchor patterns 150 and the transfer patterns 120 of the mesa portion 110 of the template 100 are embedded with the resist material of the resist layer 500, the pattern transfer regions 520 of the non-cured first portion and the non-cured second portion 513-2 of the resist layer 500 may be cured. In an embodiment, an exposure light, for example, an ultraviolet (UV) ray may be irradiated into the mesa portion 110 of the template 100 to cure the resist layer 500. As a result, the pattern transfer regions 520 may be hardened to provide cured pattern transfer regions 522 and first resist patterns 529 from the transfer patterns 120. The non-cured second portion 513-2 may be cured to provide a cured second portion 513-2U and second resist patterns 513-D (see FIG. 22) from the anchor patterns 150. Accordingly, as a result of the imprint step, the transfer patterns 120 of the template 100 may be transferred and imprinted on the pattern transfer regions 520 to form the resist patterns 529.

Referring to FIG. 21, the extruded portion 513E2 extending from the cured second portion 513-2U may be limited or confined to extend by the extrusion confining pattern 510. It may effectively prevent the extruded portion 513E2 from extending to cover the side surface 113 of the mesa portion 110 of the template 100. Due to confining the extension of the extruded portion 513E2, the thickness non-uniformity of the residual layer of the resist layer and the pattern defects may be effectively suppressed.

Referring to FIG. 22, the second resist patterns 513-D are formed on the surface of the cured second portion 513-2U of the resist layer portion of the first imprint shot region 571 and the first resist patterns 529 are formed on the surface of the cured pattern transfer region 522. After the imprint step for forming the first resist patterns 529 is applied to a first imprint shot region 571 of the resist layer 500, the template 100 may be detached from the resist layer 500 and may be shifted and aligned with a second imprint shot region 572 of the resist layer 500. Subsequently, the next imprint step may be performed to form the resist patterns 529 in the second imprint shot region 572. The imprint step may be repeatedly applied to all of imprint shot regions of the substrate 400 using the template 100. As a result, the resist patterns 529 may be formed in an entire portion of the resist layer 500 coated on the substrate 400, as illustrated in FIG. 23.

Referring to FIG. 11, the extrusion confining pattern 510 may be formed in a lattice shape surrounding the non-cured first portions, that is, the pattern transfer regions 520 that are corresponding to the field regions 220. The non-cured second portions 513-2 to which the anchor patterns 150 are to be imprinted may be dispersed in the extrusion confining pattern 510. However, the extrusion confining pattern 510 may not be limited to the lattice shape but may be modified into various shapes.

Figure 24:
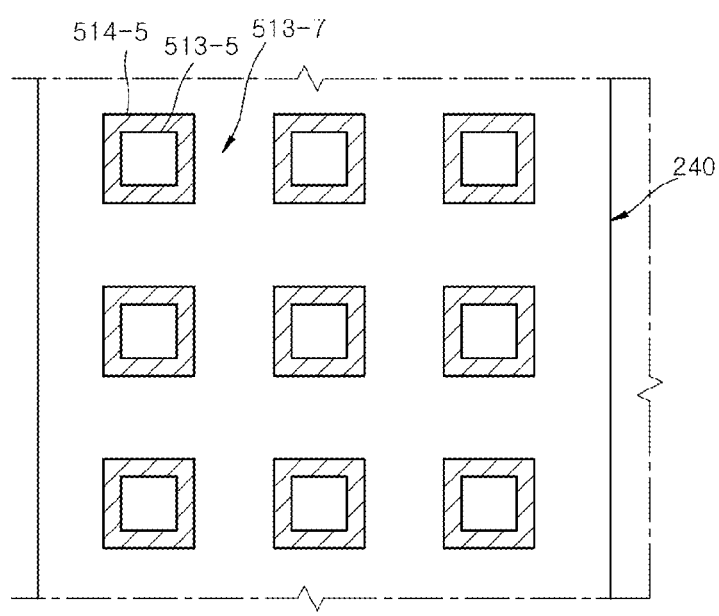
FIGS. 24 and 25 illustrate extrusion confining patterns in a plane view according to an embodiment.
Figure 25:
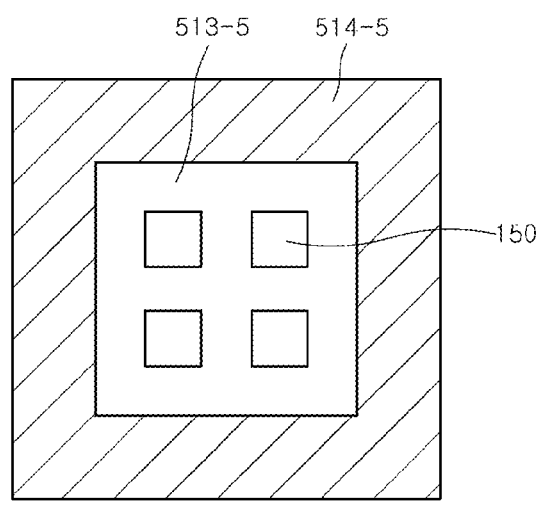

The extrusion confining pattern 510 may be deformed into a ring shape or an arrangement of donut patterns 514-5 as viewed in FIG. 24. The donut pattern 514-5 may be formed to set the third portion 513-5 that is not cured in the middle portion. The donut patterns 514-5 may be formed to set the fourth portions 513-7 that are not cured in the portions between the donut patterns 514-5. As illustrated in FIG. 25, the anchor patterns 150 may be imprinted on the non-cured third portion 513-5 inside the donut pattern 514-5 of the extrusion confining pattern. Although the case where the cured donut patterns 514-5 may be formed as the extrusion confining pattern is illustrated in FIG. 24, the extrusion confining pattern 510 may have a rectangular shape, a line shape, a bar shape, a substantially rectangular shape, substantially a line shape, substantially a bar shape, or the like.

According to the embodiments described above, nanoscale structures or nano structures can be fabricated on a large-sized substrate. The nano structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, molding processes for fabricating electronic/electric components such as nano-scaled interconnections, molding process for fabricating catalysts of solar cells and fuel cells, molding process for fabricating etch masks and organic light emitting diodes (OLEDs), and molding process for fabricating gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single chip package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of forming patterns, the method comprising:
    forming a resist layer on a substrate;
    overlaying a template over the resist layer, the template including transfer patterns disposed in field regions and anchor patterns disposed in field defining regions;
    curing an extrusion confining pattern in the resist layer to define pattern transfer regions and anchoring regions, the pattern transfer regions corresponding to the field regions and the anchoring regions corresponding to non-cured regions enclosed by the extrusion confining pattern and located where the anchor patterns are to be imprinted into the resist layer;
    pressing the template to imprint the transfer patterns and the anchor patterns of the template into the resist layer after curing the extrusion confining pattern in the resist layer to define the pattern transfer regions and the anchoring regions; and
    performing an alignment to compensate for a position error of the template relative to the resist layer,
    wherein the anchoring regions are separated from the pattern transfer regions by the extrusion confining pattern.

2. The method of claim 1, wherein the extrusion confining pattern is formed by selectively curing a portion of the resist layer to set the anchoring regions and the pattern transfer regions as non-cured regions.

3. The method of claim 2, wherein selectively curing the portion of the resist layer includes:
    aligning a photomask including shielding patterns and at least one light transmitting region defined by the shielding patterns with the resist layer so that the light transmitting region overlaps with a portion of the resist layer; and
    irradiating an exposure light into the photomask so that the exposure light selectively reaches the portion of the resist layer through the light transmitting region.

4. The method of claim 1, wherein the extrusion confining pattern includes a lattice shape with windows, and
    wherein the windows are corresponding to the pattern transfer regions.

5. The method of claim 1, wherein the anchoring region is surrounded by portions of the extrusion confining pattern.

6. The method of claim 1, wherein the extrusion confining pattern is formed by arrays of cured donut patterns, and
    the donut patterns are formed by curing portions of the resist layer.

7. The method of claim 1, wherein the resist layer is formed by spin-coating a resist material on the substrate.

8. The method of claim 1, wherein the anchor patterns are disposed along a boundary region of the field defining region.

9. The method of claim 1, wherein the anchoring regions are disposed in boundary regions and inter regions of the field defining regions.

10. A method of forming patterns, the method comprising:
    forming a resist layer on a substrate;
    curing an extrusion confining pattern to define pattern transfer regions and anchoring regions surrounding the pattern transfer regions in the resist layer, the anchoring regions corresponding to non-cured regions surrounded by the extrusion confining pattern and located where anchor patterns are to be imprinted into the resist layer;
    overlaying a template over the resist layer, the template including transfer patterns and the anchor patterns; and
    pressing the template to imprint the transfer patterns on the pattern transfer regions and to imprint the anchor patterns on the anchoring regions after curing the extrusion confining pattern, wherein the anchoring regions are separated from the pattern transfer regions by the extrusion confining pattern.

11. The method of claim 10, wherein the extrusion confining pattern is formed by selectively curing a portion of the resist layer to set the anchoring regions and the pattern transfer regions as non-cured regions.

12. The method of claim 11, wherein selectively curing the portion of the resist layer includes:
aligning a photomask including shielding patterns and light transmitting regions defined by the shielding patterns with the resist layer, the light transmitting regions corresponding to the anchoring regions and the pattern transfer regions; and
irradiating an exposure light to the photomask.

13. The method of claim 10, wherein the extrusion confining pattern includes a lattice shape with windows, and
wherein the windows are corresponding to the pattern transfer regions.

14. The method of claim 10, wherein the anchoring region is surrounded by portions of the extrusion confining pattern.

15. The method of claim 10, wherein the extrusion confining pattern is formed by arrays of cured donut patterns, and
the donut patterns are formed by curing portions of the resist layer.

16. The method of claim 10, wherein the resist layer is formed by spin-coating a resist material on the substrate.

17. The method of claim 10, wherein the anchor patterns are disposed along a boundary region of the field defining region.

18. A method of forming patterns, the method comprising:
forming a resist layer on a substrate;
curing an extrusion confining pattern to define anchoring regions in the resist layer;
overlaying a template over the resist layer, the template including transfer patterns and anchor patterns;
pressing the template to imprint the anchor patterns on the anchoring regions and to imprint the transfer patterns on a portion of the resist layer after curing the extrusion confining pattern; and
aligning the template with the resist layer,
wherein the anchoring regions correspond to non-cured regions surrounded by the extrusion confining pattern and located where the anchor patterns are to be imprinted into the resist layer, and
wherein the anchoring regions are separated from the pattern transfer regions by the extrusion confining pattern.

19. A method of forming patterns, the method comprising:
forming a resist layer including a resist material on a substrate;
overlaying a template over the resist layer, the template including transfer patterns disposed in field regions and anchor patterns disposed in field defining regions;
curing an extrusion confining pattern in the resist layer to define pattern transfer regions corresponding to the field regions and anchoring regions to which the anchor patterns are to be imprinted;
pressing the template to imprint the transfer patterns and the anchor patterns of the template into the resist layer to form an extruded portion after curing the extrusion confining pattern; and
causing an anchoring effect with the extruded portion of the resist material to reduce movement of the substrate relative to the template,
wherein the anchoring regions correspond to non-cured regions surrounded by the extrusion confining pattern and located where the anchor patterns are to be imprinted into the resist layer, and
wherein the anchoring regions are separated from the pattern transfer regions by the extrusion confining pattern.

20. The method of claim 19, wherein the extruded portion of the resist material has a thinner thickness than a thickness of the resist layer.

* * * * *